United States Patent [19]

Kim

[11] Patent Number: 5,502,319
[45] Date of Patent: Mar. 26, 1996

[54] SOLID STATE IMAGE SENSOR WITH NON-PARALLEL CONDUCTORS

[75] Inventor: Bum-Sik Kim, Suwon, Rep. of Korea

[73] Assignee: Samsung Electronics Co., Ltd., Suwon, Rep. of Korea

[21] Appl. No.: 322,395

[22] Filed: Oct. 12, 1994

Related U.S. Application Data

[63] Continuation of Ser. No. 63,786, May 20, 1993, abandoned.

[30]       Foreign Application Priority Data

May 20, 1992 [KR]    Rep. of Korea ............... 92-8497

[51] Int. Cl.⁶ ..................... H01L 27/148; H01L 29/768
[52] U.S. Cl. ................. 257/231; 257/232; 257/233; 257/249; 257/448
[58] Field of Search ........................... 257/448, 233, 257/229, 232, 231, 435, 230, 249

[56]                References Cited

U.S. PATENT DOCUMENTS 4,539,596  9/1985  Elabd ............................. 257/231 X
4,963,956  10/1990  Manabe et al. ................... 257/448
5,216,489  6/1993  Yonemoto et al. .............. 257/231 X
5,235,198  8/1993  Stevens et al. .................. 257/232

OTHER PUBLICATIONS

Yonemoto et al., "A 2 Million Pixel FIT–CCD Image Sensor for HDTV Camera System", ITEJ Technical Report, vol. 15, No. 16, Feb. 1991, pp. 7–12.

*Primary Examiner*—William Mintel
*Attorney, Agent, or Firm*—Cushman Darby & Cushman

[57]                ABSTRACT

Metal wires for applying the clock voltage in a CCD solid state image sensor are angled with respect to the photodiodes that are arranged in a matrix. Also, a photo-blocking layer is formed over the metal wires. Accordingly, light incident on portions of the sensor other than the photodiodes is effectively prevented and noise caused due to coupling with the semiconductor substrate is minimized, thereby improving the picture quality of the solid state image sensor. Furthermore, since the metal wires directly apply the clock voltage to the CCD gates, there is no need for a polysilicon gate conductor. Thus, clock skew is prevented and phase differences between the signal image from the central part and the peripheral part of the solid stage image sensor is greatly reduced.

1 Claim, 4 Drawing Sheets

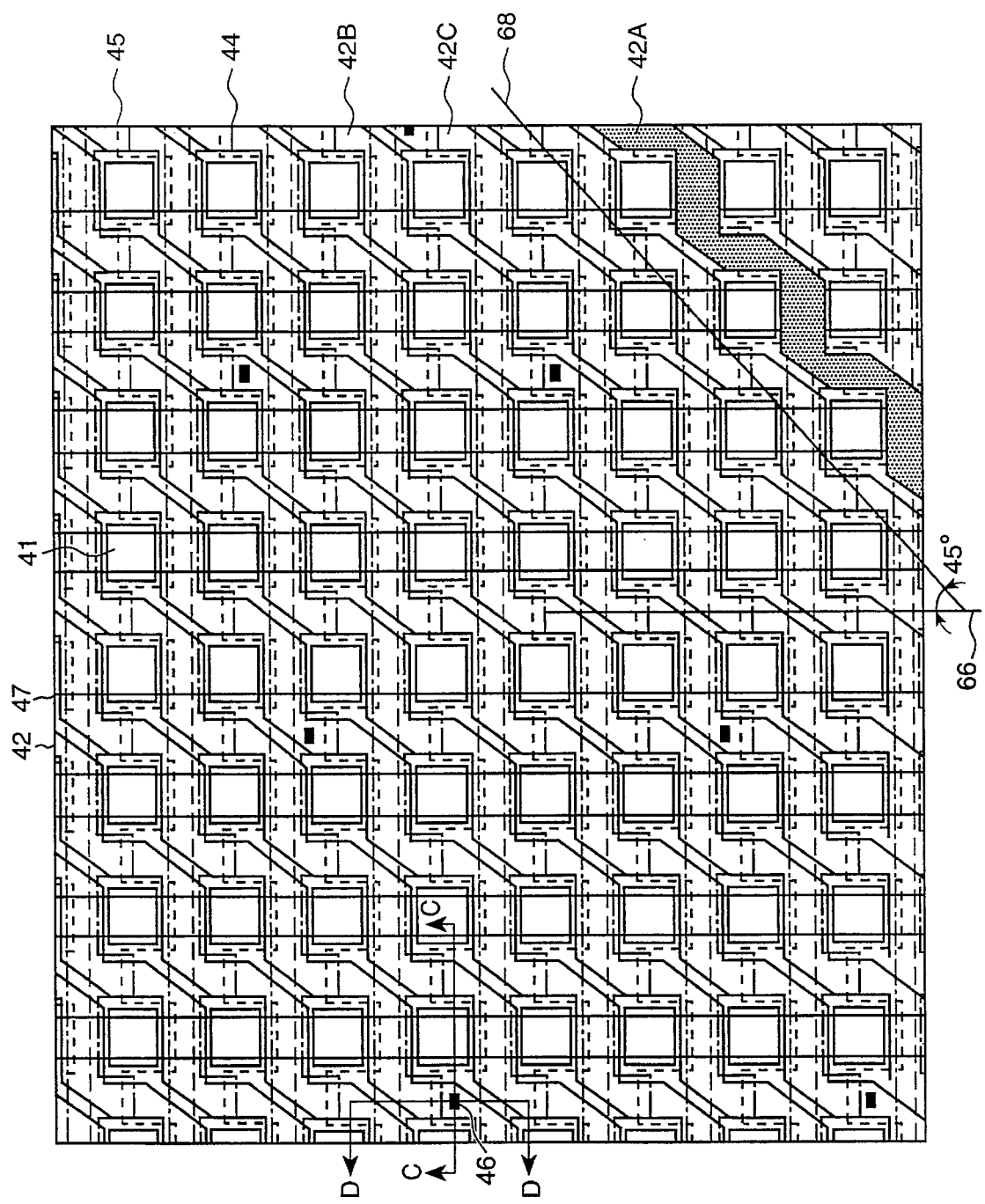

SOLID STATE IMAGE SENSOR WITH NON-PARALLEL CONDUCTORS

This is a continuation of application No. 08/063,786, filed on May 20, 1993, which was abandoned upon the filling hereof.

BACKGROUND OF THE INVENTION

1. Field of the Invention

The present invention relates to an improved solid state image sensor.

2. Background of the Related Art

In a general solid state image sensor, a signal generated by the light incident on the photodiodes is transferred to an output through charge coupled devices. The light sensed by multiple photodiodes results in an image. Such a solid stage image sensor is smaller and lighter than a conventional CRT and has a lower driving voltage and superior durability. Moreover, imaging from the visible region to infrared region is possible, so that it is widely used in cameras employing VTRs, cameras for surveillance, office appliances and medical appliances. With the development of the semiconductor fabricating technique such solid state image sensors are able to have higher pixel densities and be further miniaturized.

Solid state image sensors use two transfer methods: an interline (IT) transfer method and a frame interline (FIT) transfer method. In the IT transfer method, a signal generated in the photodiodes is directly transferred to a vertical transfer charge coupled device (referred to as a VCCD hereinafter) for output. In the FIT transfer method, a signal generated in each photodiode is also transferred and stored to a storing location and then subsequently output.

In known solid state image sensors, using the FIT transfer method, several problems may occur when increasing the transfer clock frequencies, which is necessary when the number of pixels is increased to obtain a higher resolution. In addition, the area of the photodiode itself should be enlarged or a dark current of the device should be reduced to obtain a high definition. However, implementing each of these has not been practical.

FIG. 1A is a partial plan view of a conventional solid state image sensor portion employing the FIT transfer method.

A plurality of photodiodes 11 are formed on the semiconductor substrate in a regularly spaced matrix. Metal wires 12, to which a clock signal is applied, are formed vertically between each photodiode 11. Gate conductors (or buffers) 13, made of a polysilicon, are formed underneath metal wires 12. First and second gates 14 and 15, made of polysilicon, are formed in an overlapped arrangement with insulating layers therebetween. The overlapping protruding ends occur near the contact holes associated with gate conductors 13, with the line of overlap transverse to the metal wires 12.

FIG. 1B is a cross-sectional view taken along the line of A—A of FIG. 1A.

A first well 22 of P-type impurities is formed to a predetermined depth within an N-type silicon semiconductor substrate 21. VCCDs 24 of N-type impurities are formed on the upper surface of the second well 23, and transfer gates 25 of highly doped P-type impurities are formed, being contacted one side by VCCDs 24 and the second well 23. The N-type photodiodes 11 are formed in contact with the other side of the transfer gate 25. Photodiode upper layer 26 contains highly doped P-type impurities in order to prevent the occurrence of dark current effects. The photodiodes 11 are separated from the adjacent VCCDs 24 by a channel separating layer 27 formed of highly doped P-type impurities. Over the entire surface of the above-mentioned structure a first insulating layer 28 is formed.

First gates 14 of polysilicon are formed on the surface of the first insulating layer 28 over the VCCD 24 and the transfer gate 25. A second insulating layer 30, made of insulating material such as $SiO_2$, is made to overlap the side and the upper surface of the first gate 14. First gate conductors (or buffers) 13, made of polysilicon, are formed on the second insulating layer 30. A first contact hole 16 connects each first gate conductor 13 to the first gate 14. A third insulating layer 31, formed of an insulating material such as $SiO_2$, covers the first gate conductors 13. Metal wires 12, made of a conductive material such as Al and W, are formed on the third insulating layer 31. The metal wires 12 also serve as a photo blocking layer for preventing the light from reaching portions other than the photodiodes 11. A second contact hole 17 is formed to electrically connect the metal wire 12 to the first gate conductors 13.

FIG. 1C is a cross-sectional view taken along the line B—B of FIG. 1A. FIG. 1C illustrates that first gates 14 are formed on the first insulating layer 28 in a regular spaced pattern. Second gates 15 are formed between the first gates 14 and the ends of the second gates 15 overlap with the ends of the first gates. The first and second insulating layers 28 and 30 insulate the overlapped portion of the first and the second gates.

Operation of the above described solid state image sensor is explained hereinbelow. The charges generated by the light incident on the photodiodes 11 are simultaneously transferred to VCCDs 24 via the transfer gate 25. A clocked pulse voltage is applied to the metal wire 12. The pulse voltage is supplied via the first gate conductors 13 to the first gates 14. Second gates 15 can also be pulsed with a second pulse voltage. By appropriately clocking the first and second gates 14 and 15, there is created the appropriate potential wells needed for the signal charges to be sequentially transferred down the VCCD. The transferred signal charges are then sequentially transferred into the storage location connected to one end of the VCCD 24, and then output at an output means.

Although the above described solid state image sensor uses the FIT transfer method, it still suffers from smear phenomenon because light blocking is not efficiently accomplished. Also, since the frequency of the clock signals applied to the VCCD are high and different clocks are required, the system is complicated and expensive to manufacture. Moreover, skewed clock signaling occurs because the resistance of the gate conductors formed of polysilicon is high, resulting in the occurrence of phase differences between the signal image in the central part and the peripheral part of the solid state image sensor.

SUMMARY OF THE INVENTION

It is an object of the present invention to provide a solid state image sensor which is capable of preventing smear phenomenon by effectively blocking the light incident on portions other than the photodiodes.

Another object of the present invention is to provide a solid state image sensor which is capable of minimizing the overall sensor size by using the IT transfer method.

Still another object of the present invention is to provide a solid state image sensor with a lower clock signal frequency in order to prevent undesired noise.

A still further object of the invention is to form the gate conductors with a low resistance material in order to prevent clock signal skewing and thereby remove phase differences between the signal image in the central part and the peripheral part of the solid state image sensor.

According to the present invention, there is provided a solid state image sensor including photodiodes formed of first conductive type impurities in a matrix on a semiconductor substrate. Rather than use gate conductors that are disposed perpendicular to the CCDs, the present invention uses metal wires disposed at an angle to the VCCDs, in the space between each photodiode. A photo-blocking layer formed to cover the portion other than the photodiodes is also included.

BRIEF DESCRIPTION OF THE DRAWINGS

These and other objects, features, and advantages of the present invention will become more apparent from the following description of the preferred embodiment taken in conjunction with the accompanying drawings, in which:

FIG. 2A is a plan view of an embodiment of a solid state image sensor according to the present invention.

DETAILED DESCRIPTION OF THE PREFERRED EMBODIMENT

FIG. 2A is a partial plan view of the solid state image sensor of IT transfer method according to the present invention.

Figure 1A:
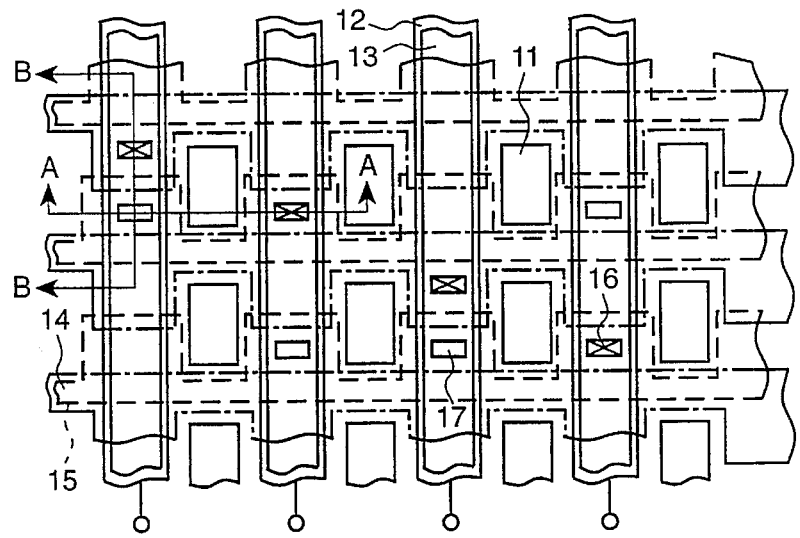
FIG. 1A is a plan view of the conventional solid state image sensor.
Figure 1B:
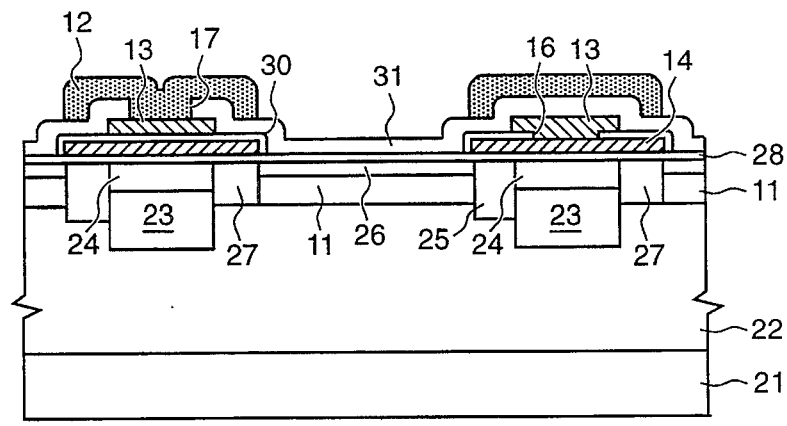
FIG. 1B is a cross-sectional view taken along the line A—A of FIG. 1A.
Figure 1C:
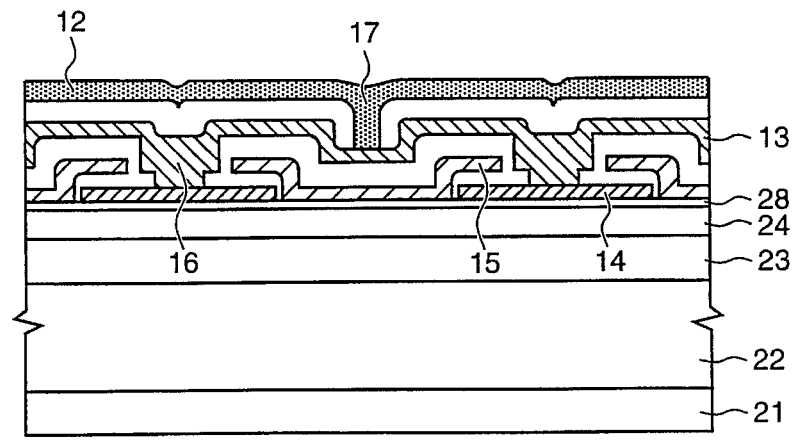
FIG. 1C is a cross-sectional view taken along the line B—B of FIG. 1B.
Figure 2B:
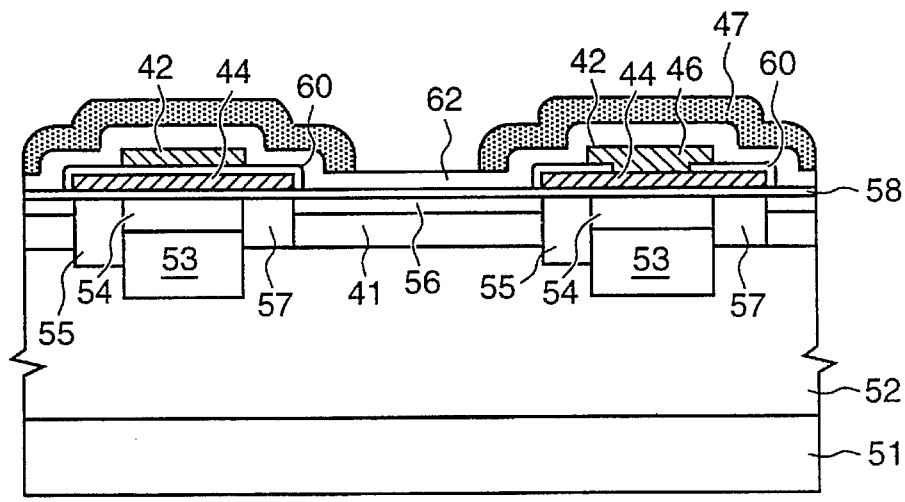
FIG 2B is a cross-sectional view taken along the line C—C of FIG. 2A.

FIG. 2B is a cross-sectional view taken along the line C—C of FIG. 2A.

Figure 2C:
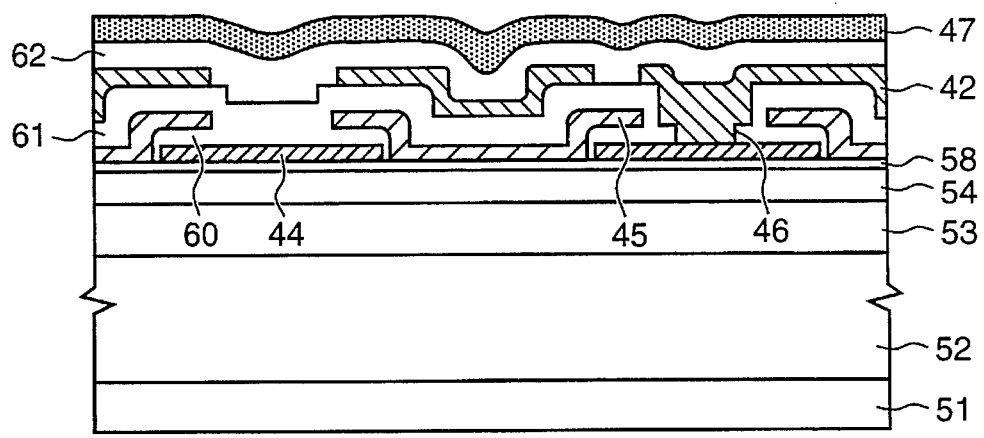
FIG. 2C is a cross-sectional view taken along the line D—D of FIG. 2A.

FIG. 2C is a cross-sectional view taken along the line D—D of FIG. 2A.

A plurality of photodiodes 41 are formed in a matrix, being regularly spaced on the semiconductor substrate. First and second gates 44 and 45, made of polysilicon, overlap with an insulating layer (not shown) therebetween. The first and second gates are located in the space between each photodiode. The ends of the first and the second gates 44 and 45 overlap with the insulating layer therebetween in a direction that forms columns of overlapping first and second gates.

Metal wires 42 are arranged in the space between the photodiodes 41. The metal wires 42 are formed with a regular pattern that is angled with respect to the columns of VCCDs. One such metal wire 42A is shaded for purposes of illustration in FIG. 2A. The line 68 indicates that an angle of approximately 45° exists with respect to the line 66 indicating the line of overlapped VCCDs. Furthermore, adjacent metal wires are connected to different gates, such that, referring to FIG. 2A, metal wires 42B are connected to first gates 44 (via contact 46) and adjacent metal wires 42C are connected to second gates 45. Thus, for example, first gates 44 can receive one clock pulse voltage and second gates 45 can receive clock pulse voltages from adjacent metal wires 42B and 42C in order to create potential wells and properly shift the imaged signal within the VCCD.

The metal wires 42, rather than being formed in a substantially straight angled line, may instead be arranged in a V-shape or other angled structure.

Figure 3:
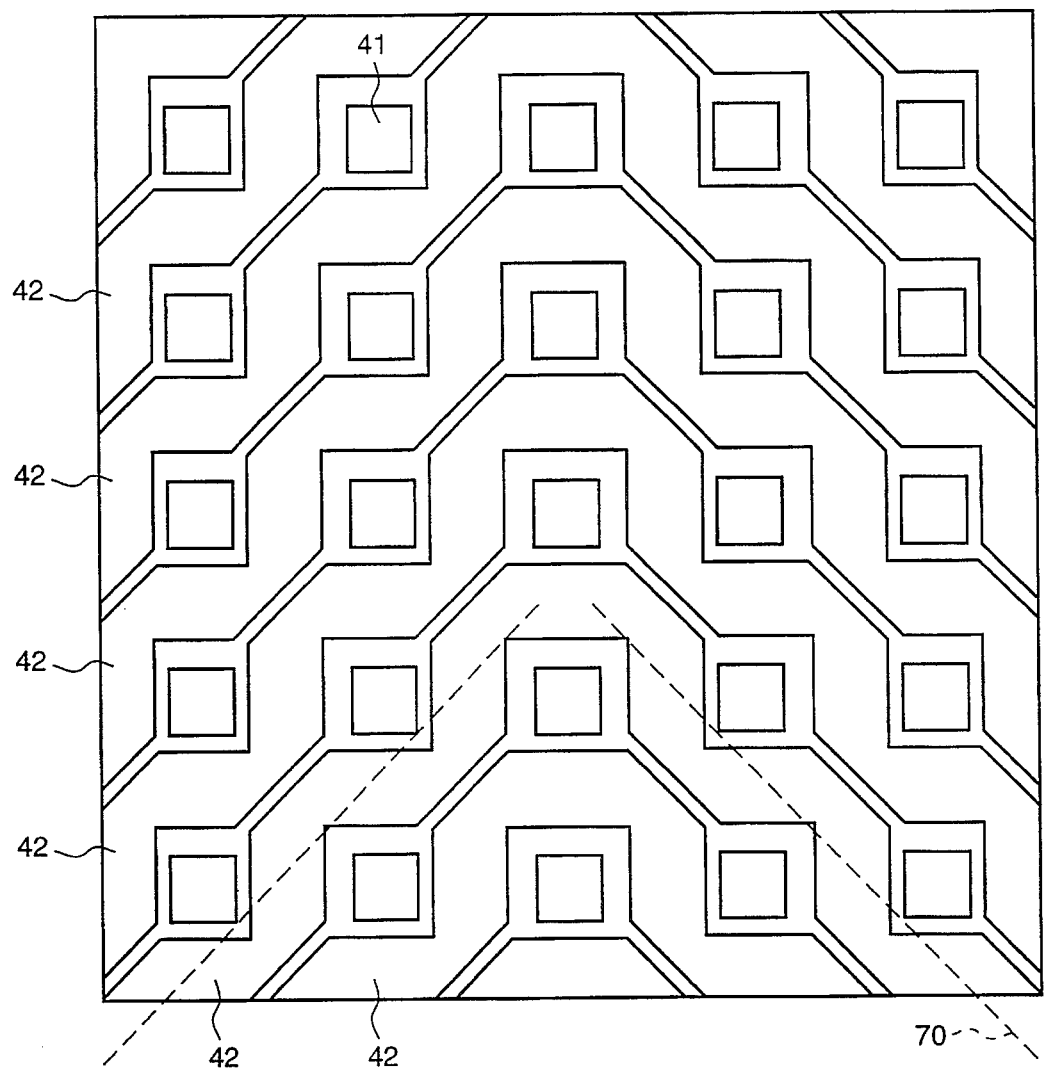
FIG. 3 illustrates an arrangement of metal wires formed in a V-shape.

FIG. 3 illustrates an alternative arrangement of metal wires 42 formed substantially in a V-shape for a portion of an image sensor according to the present invention. The dotted line 70 points out the overall V-shape.

Referring to FIGS. 2B and 2C a first well 52 of P-type impurities is formed on N-type silicon semiconductor substrate 51. Second wells 53 of highly doped P-type impurities are formed on the upper part of the first well 52, being separated in a regularly spaced manner. VCCDs 54 of N-type impurities are formed on the upper surface of the second well 53. Transfer gates 55 of highly doped P-type impurities are formed such that one side is in contact with the second well 53 and the other side is in contact with N-type photodiodes 41. Photodiode upper layers 56 contain highly doped P-type impurities to prevent the charges generated by the light from re-combining. The other side of the photodiodes 41 are separated from the adjacent VCCDs 54 by a channel separating layer 57 formed of highly doped P-type impurities. A insulating material of a first insulating layer 58 made of $SiO_2$ is formed on the semiconductor substrate 51 of the above-mentioned structure.

First gates 44 of polysilicon are formed on the surface of the first insulating layer 58 of the transfer gates 55 and VCCDs 54. A second insulating layer 60 is formed of an insulating material such as $SiO_2$ in order to cover the upper surfaces and the lateral side of the first gates 44. Second gates 45 are formed between each first gate 44. Both ends of the second gates 45 are extended and overlapped in a predetermined pattern with the adjacent first gate 44. Between the first and the second gates 44 and 45, a second insulating layer 60 is formed, and a third insulating layer 61 is formed to cover the second gate 45. Metal wires 42 are then formed on the surface of third insulating layer 61 disposed over the second gates 45.

Metal wires 42 are preferably made of a conductive material having low resistance such as Al, W or WSi and used for applying the appropriate clock voltage. However, very low resistance polysilicon can also be used.

The second insulating layer 60 is partially removed in order to form a contact hole 46 and establish electrical contact between the first gate 44 and metal wires 42. A similar contact, if desired and as explained previously, can be made between adjacent wires 42 and second gate 45. A fourth insulating layer 62 made of insulating material such as $SiO_2$ is then formed over the entire surface of the above-mentioned structure. A photo-blocking layer 47 made of a material which does not permit light to pass, such as Al, is then formed on the fourth insulating layer 62 to cover the metal wires 42, thereby blocking the light from being incident to the portion other than the photodiodes 41.

Therefore, in the present invention, metal wires for applying a clock voltage to a solid state image sensor are angled (or slantingly formed in a zigzag pattern) in the space between each photodiode and then a photo-blocking layer is formed. Accordingly, light incident on portions of the sensor other than the photodiodes is effectively prevented. Thus, noise caused due to the coupling with respect to the semiconductor substrate is minimized, thereby improving the picture quality of the solid state image sensor.

In addition, the pattern used by metal wires 42 allows a compact arrangement of elements, thus allowing larger photodiodes and potential for miniaturization. Moreover, the reduction in the frequency of the clock signal applied to VCCDs allows circuit simplification. Furthermore, since the metal wires directly apply the clock voltage without forming a gate conductor of polysilicon, clock skew is prevented as well as phase differences in the image signal between the central part and the peripheral part of the solid state image sensor gate conductor. Finally, the process steps are simplified because there is no use of a polysilicon gate conductor layer.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What is claimed is:

1. A charge coupled solid state image sensor device comprising:

a plurality of photodiodes arranged in a matrix on a semiconductor substrate;

a plurality of charge coupled devices, disposed in said semiconductor substrate, each charge coupled device adjacent at least one of said plurality of photodiodes, said plurality of charge coupled devices thereby being arranged in a plurality of substantially straight lines;

a plurality of transfer gates, each transfer gate connecting one of said plurality of photodiodes to a respective one of said plurality of charge coupled devices;

a first insulating layer disposed over said photodiodes and said charge coupled devices;

a plurality of overlapping gates arranged over said first insulating layer;

a second insulating layer disposed between overlapping portions of said plurality of overlapping gates;

a third insulating layer disposed over said plurality of overlapping gates and over said second insulating layer;

a plurality of conductors formed of a conductive material and disposed over said third insulating layer and arranged at a non-parallel angle with respect to said plurality of charge coupled devices arranged in said plurality of substantially straight lines, each of said plurality of conductors being directly in contact with at least one of said plurality of overlapping gates through said second insulating layer and said third insulating layer; and a photo-blocking layer formed on said plurality of conductors.

* * * * *